(12) United States Patent
Ma et al.

(10) Patent No.: US 12,703,928 B2
(45) Date of Patent: Aug. 11, 2026

(54) DEVICE AND METHOD FOR GROWING SILICON CARBIDE SINGLE CRYSTAL BASED ON PVT METHOD

(71) Applicant: CEC COMPOUND SEMICONDUCTOR CO., LTD, Ningbo (CN)

(72) Inventors: Yuan Ma, Ningbo (CN); Weiming Xue, Ningbo (CN); Yaobo Pan, Ningbo (CN)

(73) Assignee: Centrasky Crystal Science (Ningbo) Semiconductor Materials Co., Ltd., Ningbo (CN)

( * ) Notice: Subject to any disclaimer, the term of this patent is extended or adjusted under 35 U.S.C. 154(b) by 100 days.

(21) Appl. No.: 18/858,339

(22) PCT Filed: Aug. 10, 2022

(86) PCT No.: PCT/CN2022/111456
§ 371 (c)(1),
(2) Date: Feb. 25, 2025

(87) PCT Pub. No.: WO2023/201934
PCT Pub. Date: Oct. 26, 2023

(65) Prior Publication Data

US 2026/0159990 A1 Jun. 11, 2026

(30) Foreign Application Priority Data

Apr. 22, 2022 (CN) ........................ 202210424984.0

(51) Int. Cl.
*C30B 23/00* (2006.01)
*C30B 29/36* (2006.01)
*C30B 35/00* (2006.01)

(52) U.S. Cl.
CPC ............ *C30B 23/002* (2013.01); *C30B 29/36* (2013.01); *C30B 35/002* (2013.01)

(58) Field of Classification Search
CPC ....... C30B 23/00; C30B 23/002; C30B 29/36; C30B 35/002
See application file for complete search history.

(56) References Cited

U.S. PATENT DOCUMENTS 6,214,108 B1 * 4/2001 Okamoto ................ C30B 29/36 427/249.17
6,261,363 B1 * 7/2001 Vodakov ................ C30B 23/00 117/106

(Continued)

FOREIGN PATENT DOCUMENTS

CN 112030232 A 12/2020
CN 112126975 A * 12/2020 ............. C30B 29/36

(Continued)

*Primary Examiner* — Robert M Kunemund
(74) *Attorney, Agent, or Firm* — IPRTOP LLC

(57) ABSTRACT

A device and a method for growing a silicon carbide single crystal based on a PVT method are provided. The device comprises a growth chamber, a crucible, one or more lifting rods, and a stock bin for holding raw materials. The crucible, the lifting rods and the stock bin are located within the growth chamber, and the stock bin is located within the crucible. The stock bin comprises independent storage compartments, and each of the lifting rods extends from a bottom of the crucible, passes through a bottom of one of the storage compartments, and extends to a top of the storage compartment. The lifting rod moves upward and downward to seal the storage compartment, or creating a channel for gas-phase raw materials transmission at the top of the storage compartment. This device increases the utilization rate of raw materials and improves the quality of crystal growth.

14 Claims, 5 Drawing Sheets

(56) References Cited

U.S. PATENT DOCUMENTS

| | | | | |
|---|---|---|---|---|
| 6,336,971 | B1 * | 1/2002 | Nagato | C30B 23/00 117/88 |
| 8,858,709 | B1 | 10/2014 | Zwieback et al. | |
| 2002/0020342 | A1 * | 2/2002 | Yamada | C30B 1/10 117/84 |
| 2002/0083885 | A1 * | 7/2002 | Kuhn | C30B 23/00 117/3 |
| 2021/0395917 | A1 * | 12/2021 | Ma | C01B 32/956 |
| 2022/0392761 | A1 * | 12/2022 | Chiu | C30B 29/36 |
| 2023/0044970 | A1 * | 2/2023 | Uematsu | C30B 25/16 |
| 2023/0059271 | A1 * | 2/2023 | Chen | C30B 23/063 |

FOREIGN PATENT DOCUMENTS

| | | | | |
|---|---|---|---|---|
| CN | 114525587 | A | 5/2022 | |
| JP | 2001072491 | A | 3/2001 | |
| JP | 3811624 | B2 * | 8/2006 | H10P 14/3408 |
| WO | WO 2013002540 | A2 | 1/2013 | |

* cited by examiner

>1000
<1000
<800
<600
<400
<200

DEVICE AND METHOD FOR GROWING SILICON CARBIDE SINGLE CRYSTAL BASED ON PVT METHOD

FIELD OF THE INVENTION

The present disclosure relates to the technical field of silicon carbide single crystal growth, in particular to a device and a method for growing a silicon carbide single crystal based on a PVT method.

BACKGROUND OF THE INVENTION

Third-generation semiconductor materials are becoming the backbone of new information technology. With ongoing advancements in semiconductor technology, silicon carbide (SiC), a third-generation wide bandgap material, has seen rapid development due to its excellent properties and significant application potential. This has made the growth of SiC crystals and related devices a hot topic. Some companies have already announced the production of 8-inch SiC.

The main methods for growing SiC single crystals include the physical vapor transport (PVT) method, the high-temperature chemical vapor deposition method, and the solution method. Currently, the PVT method is becoming the standard for growing SiC single crystals due to its high growth rate, stable process, and cost advantages. The PVT process involves the sublimation of polycrystalline SiC under high temperature and low pressure. Driven by a temperature gradient, the resulting gas phase components (mainly Si, $Si_2C$, $SiC_2$) reach the seed crystal at a lower temperature, creating supersaturation and continuously growing single crystals on the seed crystal. In the PVT method, SiC powder is placed at the bottom of a graphite crucible, with the SiC seed crystal near the crucible lid. The crucible is heated by radio frequency induction, insulated by graphite felt or porous graphite, creating a temperature gradient. The sublimated gas phase components condense and crystallize on the seed crystal, forming SiC single crystals.

Currently, the dominant 6-inch SiC crystals in mass production have a material utilization rate of about 40%. That is, 3 kg of raw material can yield a 6-inch crystal with a thickness of about 20 mm and a weight of about 1.2 kg. The crucible diameter ranges from 150 mm to 200 mm, and under typical thermal field conditions, the temperature difference between the center and the edge of the raw material is close to 12° C. For the growth of SiC crystals larger than 8 inches, non-patent literature (Lu Jiazheng, Zhang Hui, Zheng Lili, Ma Yuan, et al. Thermal Field Design and Optimization for Large-Size Resistance-Heated Silicon Carbide Crystal Growth [J]. Journal of Synthetic Crystals, 2022.) indicates that when the crucible diameter exceeds 200 mm, the temperature difference between the center of the raw material and the temperature near the inner wall of the crucible will be greater than 15° C. Due to this temperature difference, when the gas phase raw material rises from the bottom to the center of the crucible, it reaches saturation and crystallizes on the upper raw material, preventing it from reaching the crystal growth interface, thus reducing material utilization. Additionally, due to the agglomeration of the upper raw material and the evaporation of the lower raw material, the agglomerated part may suddenly collapse during crystal growth, causing a sudden change in the heat transfer mechanism and leading to crystal quality issues.

On the other hand, since 4H SiC often grows with a 4-degree offset between the C-plane [0001] and the A-plane

[11$\bar{2}$0], with [0001] and [11$\bar{2}$0] representing crystal planes of SiC single crystals. Research and related technologies have confirmed that asymmetric growth is more conducive to reducing the proliferation of certain defects in the crystal (Zhang Fusheng, Yang Kun, Liu Xinhui, et al. Preparation of 6-Inch Silicon Carbide Single Crystals without Micropipe Defects [J]. Journal of the Chinese Ceramic Society, 2021, U.S. Pat. No. 7,364,617 B2). However, this asymmetric temperature distribution growth method creates more asymmetric thermal stress distribution for crystals larger than 8 inches, increasing the likelihood of crystal cracking.

When the diameter of SiC crystals reaches 100 mm, many companies have encountered issues such as reduced material utilization and decreased crystal quality due to the collapse of crystallized parts. To address this, Cree has provided relevant technical solutions (U.S. Pat. No. 8,741,413B2). With the development of the SiC crystal industry, more and more solutions are emerging to address these issues, such as placing the raw material in an isothermal zone to minimize the temperature difference between the edge and the center of the raw material (Chinese patent CN111424320A), arranging heating devices at low-temperature areas of the raw material to reduce the temperature difference (Chinese patent applications CN201921527970.1 and CN201610175716.4). Although these solutions can alleviate the problem of premature saturation of the gas phase raw material due to the temperature difference between the center and the edge to some extent, they cannot support the growth of crystals larger than 8 inches and thicker than 20 mm due to insufficient feeding space. Other solutions include placing a small amount of raw material in the isothermal zone and using carrier gas to bring the raw material into the growth zone (Chinese patent applications CN202111448112.X and CN202111446990.8). These solutions have similar benefits to the CVD method, but the CVD raw material is provided by an organic gas source, whose concentration does not change significantly over time, and the growth thickness is only measured in microns. The PVT method cannot ensure consistent component ratios over time, thus failing to achieve stable large-size crystal growth. Other solutions involve increasing the density of the raw material (Chinese patent application CN202120267484.1) to increase the crystal yield per unit volume of raw material. While this method can indeed produce more crystals, it may not be effective as the crystal size continues to increase. Another solution involves using graphite columns to disperse the raw material within the crucible (Chinese patent application CN202111361145.0) to prevent gas phase raw material from crystallizing in the raw material zone. However, the size of the isothermal zone within the crucible is fixed, thus limiting the amount of raw material that can be fed.

Furthermore, none of the above technical solutions address the issue of asymmetric stress on the crystal caused by asymmetric thermal fields.

SUMMARY OF THE INVENTION

In view of the above-mentioned shortcomings, the present disclosure provides a device and a method for growing a silicon carbide single crystal based on a PVT method, which address issues such as low raw material utilization, significant temperature differences between the edge and center of the crucible, and reduced crystal quality due to the collapse of the crystallized parts. These problems are particularly pronounced when trying to obtain silicon carbide single crystals larger than 8 inches, leading to more asymmetric thermal stress distribution and increasing the likelihood of crystal cracking.

A first aspect of the present disclosure provides a device for growing a silicon carbide single crystal based on a PVT method. This device comprises a growth chamber, a crucible, one or more lifting rods, and a stock bin for holding raw materials. The crucible, the lifting rods, and the stock bin are located in the growth chamber, and the stock bin is located in the crucible. The stock bin comprises independent storage compartments, and each of the lifting rods extends from a bottom of the crucible, passes through a bottom of one of the storage compartments, and extends to a top of the storage compartment. The lifting rod moves upward and downward to seal the storage compartment, or creating a channel for gas-phase raw materials transmission at the top of the storage compartment.

Optionally, an exhaust hole is located at the top of each storage compartment and serves as the channel for gas-phase raw materials transmission. A top of each lifting rod is provided with an end surface matching the corresponding exhaust hole. When the lifting rod moves upward and the end surface of the lifting rod abuts the exhaust hole, the storage compartment is sealed, and when the lifting rod moves downward and the end surface of the lifting rod is away from the exhaust hole, gas-phase raw materials are discharged from the storage compartment through the exhaust hole.

Optionally, a diameter of each exhaust hole ranges from 0.1 mm to 5 mm, and a lower portion of each exhaust hole is provided with a conical surface that matches the end surface of the corresponding lifting rod, with a conical angle of the conical surface ranging from 5° to 85°.

Optionally, a frustum with a height of 1 mm to 5 mm and a diameter of 1 mm to 10 mm is located at the top of each lifting rod, and the frustum is connected with the end surface of the lifting rod.

Optionally, each storage compartment is sealed by a graphite thin cover and/or several layers of graphite paper, with a thickness of the graphite thin cover ranging from 0.1 mm to 2 mm, and the lifting rod moves upward to form a hole in the graphite thin cover and/or the several layers of graphite paper, creating the channel for gas-phase raw materials transmission.

Optionally, an end surface of each lifting rod is arc-shaped, and a roughness of the end surface is not greater than 1.6 μm.

Optionally, the storage compartments of the stock bin are concentric circular structures or concentric polygonal structures arranged inside the crucible based on their inner diameters; or planar shapes of the storage compartments comprise one or more of triangles, quadrilaterals, hexagons, and circles, and the storage compartments are arranged in a honeycomb pattern.

Optionally, a top of the stock bin has a parabolic structure with a lower middle and higher edges.

Optionally, a thickness of a sidewall of the crucible ranges from 5 mm to 25 mm, and a thickness of a sidewall of each of the storage compartments ranges from 0.5 mm to 3 mm. Each lifting rod is a graphite rod with a diameter of 2 mm to 15 mm.

Optionally, the bottom of the crucible is provided with threaded holes, and each of the lifting rods is arranged in one of the threaded holes and is threadedly engaged with the threaded hole. Each lifting rod is configured to move upward and downward by adjusting a thread engagement length of the lifting rod within the threaded hole.

A second aspect of the present disclosure provides a method for growing a silicon carbide single crystal based on a PVT method, comprising:

S1: providing a device as provided in the first aspect of the present disclosure, and further configuring the device such that a holder where a silicon carbide seed crystal is fixed is located in the growth chamber and above the stock bin, the raw materials are stored in the storage compartments, and each of the one or more lifting rods extends from the bottom of the crucible, passes through one of the storage compartments, and extends to the top of the storage compartment, keeping the storage compartment sealed;

S2: placing the crucible in a thermal field, and when the thermal field reaches a preset temperature and pressure, moving some of the lifting rods near an edge of the stock bin to release gas-phase raw materials through exhaust holes of a first subset of the storage compartments, causing a surface of the silicon carbide seed crystal to begin nucleating stably for a first period;

S3: moving other ones of the lifting rods near a center of the stock bin to release gas-phase raw materials through exhaust holes of a second subset of the storage compartments, causing the surface of the silicon carbide seed crystal to continue nucleating stably for a second period;

S4: repeating steps S2 and S3 until the gas-phase raw materials in the storage compartments are completely released, completing growth of the silicon carbide single crystal.

Optionally, when using a silicon carbide seed crystal with an offset angle greater than 2° between a C-plane [0001] and an A-plane [11$\bar{2}$0], amounts of the raw materials in different storage compartments are adjusted to selectively reduce gas-phase raw materials released from those of the storage compartments below the C-plane, enabling the silicon carbide seed crystal to grow with a non-axisymmetric concentration under an axisymmetric temperature distribution.

Optionally, after the crucible is placed in the thermal field, an initial atmosphere in the thermal field is at a pressure of 500 mbar to 800 mbar, then the crucible is heated and stays at 2200° C.-2450° C. for 30 min to 5 h, and the pressure is reduced to 0.5 mbar to 50 mbar over a period of 1 h to 15 h. The first period and the second period are both 5 h to 50 h. After the growth of the silicon carbide single crystal is completed, the pressure of the thermal field is adjusted to 100 mbar to 600 mbar, a heating power is reduced to zero over 5 h to 10 h, and the crucible is naturally cooled to room temperature before removing the silicon carbide single crystal.

Optionally, the silicon carbide single crystal is greater than or equal to 8 inches, and a thickness of the silicon carbide single crystal is greater than or equal to 15 mm.

As described above, the device and method of the present disclosure have following beneficial effects. By dividing the stock bin into independent storage compartments and using the lifting rods to release the gas-phase raw materials in the storage compartments based on the needs of various stages of the growth of the silicon carbide single crystal, the device of the present disclosure enables the gradual evaporation of the raw materials across different temperature zones, keeping the concentration of each component consistent throughout the entire growth of the silicon carbide single crystal. Additionally, since the raw materials in the central low-temperature area can be fully utilized in the later stages of crystal growth, the utilization rate of raw materials with this device can be increased by more than 10% compared to traditional devices. Furthermore, while maintaining the axial symmetry of the thermal field, the device of the present disclosure can more effectively achieve asymmetric growth to suppress defects and prevent crystal cracking caused by asymmetric stress, significantly improving the quality of crystal growth.

DETAILED DESCRIPTION OF THE INVENTION

Figure 1:
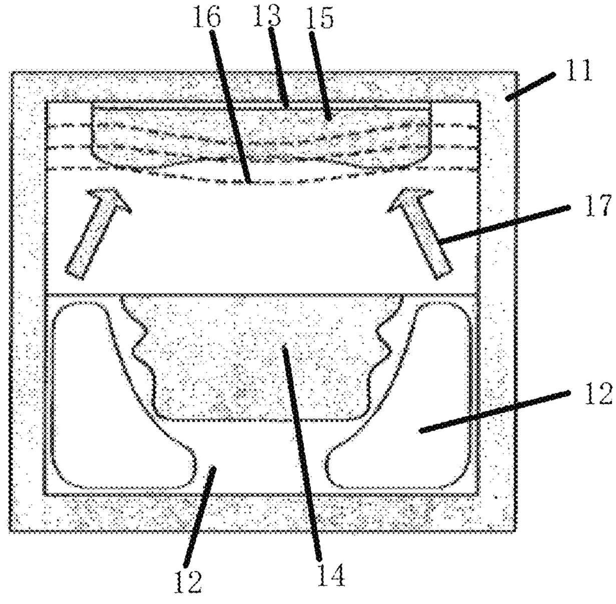
FIG. 1 shows a schematic diagram of gas-phase raw materials transmission in a crucible in a comparative embodiment.

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. For example, when the embodiments of the present disclosure are described in detail, for ease of description, the cross-sectional view showing the device structure will not be partially enlarged according to the general scale, and the schematic diagram is only an example, which should not limit the scope of protection. In addition, the actual production should include the length, width and depth of the three-dimensional space dimensions.

For the convenience of description, spatial relation terms such as "below", "under", "beneath", "on", "above", "up", etc. may be used herein to describe the relationships between an element or feature and other elements or features. It will be understood that these spatial relationship terms are intended to encompass directions/orientations of the device in use or operation other than those depicted in the drawings. In addition, when a first layer is referred to as being "between" a second layer and a third layer, the first layer may be the only layer between the second and third layers, or there may more layers between the two layers.

In the context of this disclosure, the structure described with a first feature "on top" of a second feature may include embodiments where the first and second features are formed in direct contact, or it may include embodiments where additional features are formed between the first and second features such that the first and second features are not in direct contact.

It should be noted that the drawings provided in this disclosure only illustrate the basic concept of the present disclosure in a schematic way, so the drawings only show the components closely related to the present disclosure. The drawings are not necessarily drawn according to the number, shape and size of the components in actual implementation; during the actual implementation, the type, quantity and proportion of each component can be changed as needed, and the components' layout may also be more complicated. To make the illustration as concise as possible, not all structures are marked in the drawings.

Please refer to FIGS. 4-9.

Figure 4:
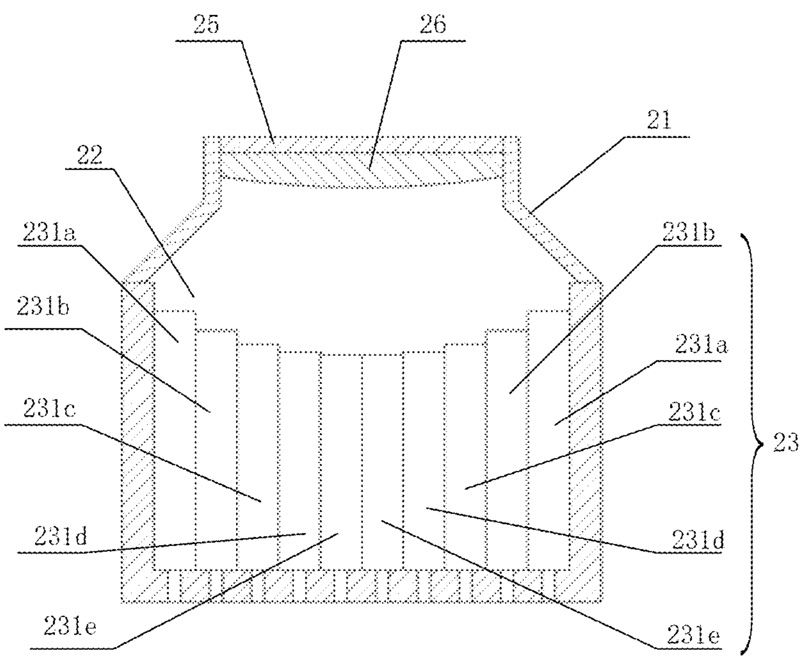
FIG. 4 shows a schematic structural diagram of a device according to Embodiment 1 of the present disclosure.
Figure 5:
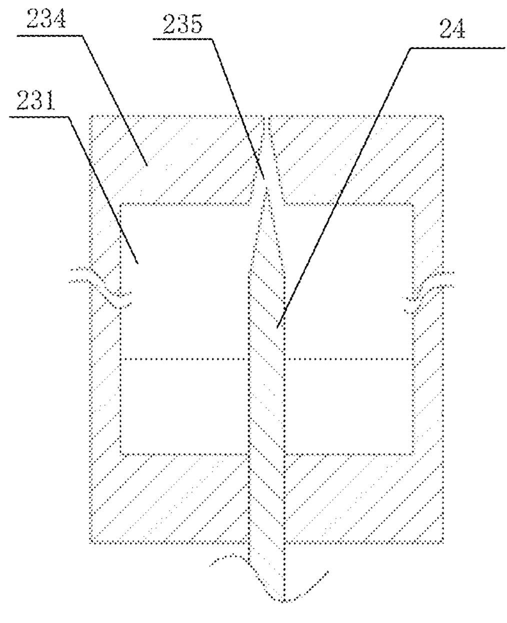
FIG. 5 is a schematic diagram showing the positional relationship between a storage compartment and a lifting rod according to Embodiment 1 of the present disclosure.
Figure 6:
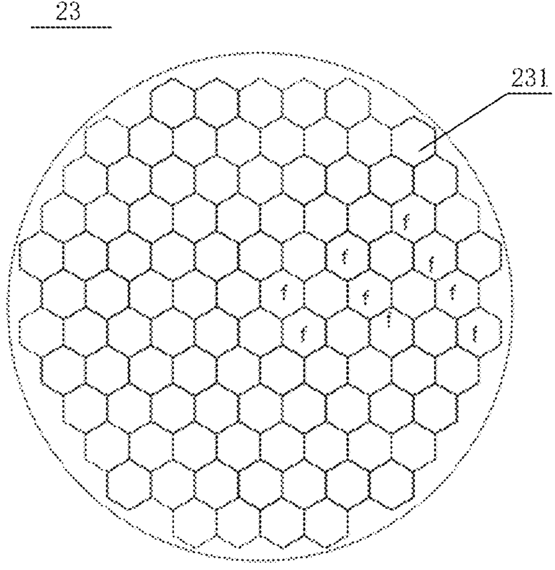
FIG. 6 shows a top view of a stock bin according to Embodiment 1 of the present disclosure.
Figures 7, 8:
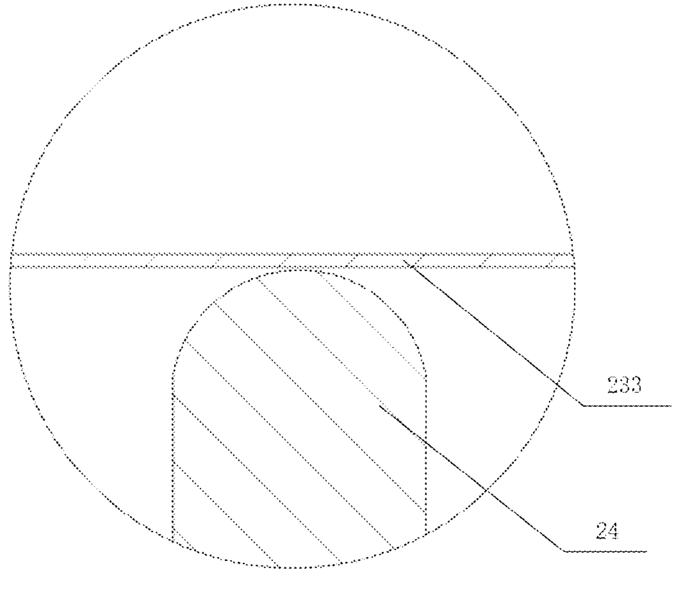
FIG. 7 is a partial enlarged view showing the positional relationship between a storage compartment and a lifting rod according to Embodiment 2 of the present disclosure.
FIG. 8 shows a defect distribution diagram of a crystal after asymmetric growth under an axisymmetric temperature distribution within a crucible according to Embodiment 2 of the present disclosure.
Figure 9:
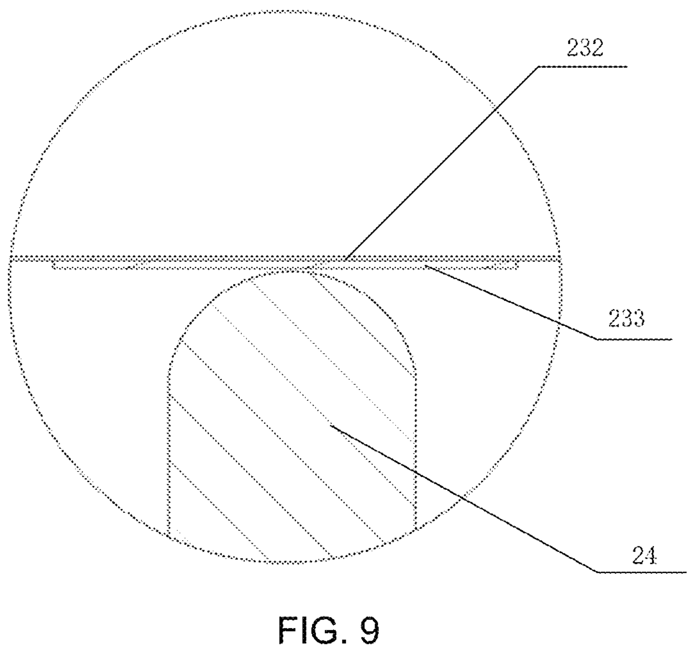
FIG. 9 shows a schematic diagram of a top of a storage compartment sealed by several layers of graphite paper according to Embodiment 3 of the present disclosure.

As shown in FIGS. 4-9, the present disclosure provides a device for growing a silicon carbide single crystal based on a PVT method. This device comprises a growth chamber 21, a crucible 22, one or more lifting rods 24, and a stock bin 23 for holding raw materials. The crucible 22, the lifting rods 24, and the stock bin 23 are located in the growth chamber 21, and the stock bin 23 is located in the crucible 22. The stock bin 23 comprises independent storage compartments. It should be noted that "independent" here means that the raw materials in each storage compartment 231 do not come into contact with each other and do not interfere with each other during the supply process. This allows for the selection of specific compartments 231 to supply gas-phase raw materials as needed during the crystal growth. Each storage compartment 231 can be a detachable unit, or they can be integrally connected; or the storage compartments 231 can be described as multiple independent enclosed areas within a single stock bin 23, separated by partition materials. Thus, the physical form of each storage compartment 231 is only illustrative. Each of the lifting rods 24 extends from a bottom of the crucible 22, passes through a bottom of one of the storage compartments 231 (the bottom of each storage compartment 231 is sealed), and extends to a top 234 of the storage compartment 231. The lifting rod moves upward and downward to seal the storage compartment 231, or creating a channel for gas-phase raw materials transmission at the top 234 of the storage compartment 231. Depending on the specific design of the top 234 of the storage compartment 231, the effect of the lifting rod's movement varies. In one embodiment, as shown in FIG. 5, an exhaust hole 235 is located at the top 234 of each storage compartment 231 and serves as the channel for gas-phase raw materials transmission. A top of each lifting rod 24 is provided with an end surface matching the corresponding exhaust hole 235. When the lifting rod 24 moves upward and the end surface of the lifting rod 24 abuts the exhaust hole 235, the storage compartment 231 is sealed, and when the lifting rod 24 moves downward and the end surface of the lifting rod 24 is away from the exhaust hole 235, gas-phase raw materials are discharged from the storage compartment 231 through the exhaust hole 235. In another embodiment, the top 234 of each storage compartment 231 is originally sealed, for example, with a graphite thin cover 233 (as shown in FIG. 7). More specifically, the top 234 of each storage compartment 231 may be sealed with an isostatic graphite thin cover, or with single or multiple layers of graphite paper 232. Additionally, as shown in FIG. 9, the top 234 of each storage compartment 231 can be sealed with both the graphite thin cover 233 and the graphite paper 232. The lifting rod 24 moves upward to form a hole at the top 234 of the storage compartment 231, such as in the graphite thin cover and/or the graphite paper, creating the channel for gas-phase raw materials transmission. By dividing the stock bin into independent storage compartments and using the lifting rods to release the gas-phase raw materials in the storage compartments based on the needs of various stages of the growth of the silicon carbide single crystal, the device of the present disclosure enables the gradual evaporation of the raw materials across different temperature zones, keeping the concentration of each component consistent throughout the entire growth of the silicon carbide single crystal. Additionally, since the raw materials in the central low-temperature area can be fully utilized in the later stages of crystal growth, the utilization rate of raw materials with this device can be increased by more than 10% compared to traditional devices. Furthermore, while maintaining the axial symmetry of the thermal field, the device of the present disclosure can more effectively achieve asymmetric growth to suppress defects and prevent crystal cracking caused by asymmetric stress, significantly improving the quality of crystal growth.

When the top 234 of each storage compartment 231 is pre-equipped with an exhaust hole 235, a diameter of each exhaust hole 235 is preferably between 0.1 mm and 5 mm. Preferably, as shown in FIG. 5, a lower portion of each exhaust hole 235 is provided with a conical surface that matches the end surface of the corresponding lifting rod 24, with a conical angle of the conical surface ranging from 5° to 85°, preferably from 30° to 60°. To ensure a better fit between the lifting rods 24 with the exhaust holes 235, preferably, a frustum with a height of 1 mm to 5 mm and a diameter of 1 mm to 10 mm is located at the top of each lifting rod 24, and the frustum is connected with the end surface of the lifting rod 24. Preferably, the end surface of each lifting rod 24 is a conical surface, with a conical angle of the conical surface ranging from 5° to 85°, preferably from 30° to 60°, which allows for better control of the opening and sealing of the storage compartments 231, making it easier to regulate the release of the gas-phase raw materials in the storage compartments 231.

As an example, when using the graphite thin cover to seal the top of each storage compartment 231, a thickness of the graphite thin cover is preferably between 0.1 mm and 2 mm, such as 0.1 mm, 0.5 mm, 1 mm, 2 mm, or any value within this range. It should be noted that all numerical ranges in this document include the endpoints, unless otherwise specified.

When both the graphite thin cover 233 and the graphite paper 232 are used for sealing, as shown in FIG. 9, the graphite thin cover 233 may be placed below the graphite paper 232, and dimensions of the graphite paper 232 match that of an opening of the top 234 of the corresponding storage compartment 231, meaning the graphite paper 232 seals the top 234 of the storage compartment 231. Dimensions of the graphite thin cover 233 are smaller than those of the opening of the top 234 of the storage compartment 231, for example, the graphite thin cover 233 may be a disc structure slightly larger than the end surface of the corresponding lifting rod 24 that it contacts. The end surface of each lifting rod 24 is preferably arc-shaped, with a roughness Ra of the end surface not greater than 1.6 μm, allowing the lifting rod 24 to create a relatively regular hole at the top of the storage compartment 231. When the lifting rod 24 moves upward, it first contacts the graphite thin cover 233, and then the pressure from the lifting rod 24 is transferred to the graphite paper 232 through the graphite thin cover 233, causing the part of the graphite paper 232 corresponding to the graphite thin cover 233 to break and form the hole for gas-phase raw materials transmission. This setup prevents the top of the storage compartment 231 from breaking all at once, allowing for better control of the hole size and, consequently, better control of the release of the gas-phase raw materials, improving raw material utilization and the quality of crystal growth.

In one embodiment, as shown in FIG. 4, the storage compartments 231 of the stock bin are concentric circular structures or concentric polygonal structures arranged inside the crucible 22 based on their inner diameters. In other embodiments, as shown in FIG. 6, planar shapes of the storage compartments 231 comprise one or more of triangles, quadrilaterals, hexagons, and circles, the storage compartments 231 are arranged in a honeycomb pattern, and the storage compartments 231 of the same stock bin 23 may be the same or different in shape. The number of the storage compartments 231 and their specific sizes can be set as needed. Preferably, one stock bin is divided into at least three storage compartments 231 to correspond to a center area, a middle area, and an edge area of the stock bin 23. In a preferred embodiment, the top of the stock bin 23 has a parabolic structure with a lower middle and higher edges (see FIG. 4), corresponding to the isothermal contour map of the crucible 22 during crystal growth, allowing for better control of the thermal field distribution, and improving the raw material utilization.

The storage compartments 231 and the lifting rods 24 may be in a one-to-one correspondence, meaning each storage compartment 231 is correspondingly provided with one lifting rod 24, and in some other embodiments, two or more lifting rods 24 may be arranged in different corresponding areas of the same storage compartment 231 (when the storage compartment 231 has a concentric circular structure), or the lifting rods 24 may be arranged in only some of the storage compartments 231 as needs, but preferably, each storage compartment 231 is provided with at least one lifting rod 24.

The lifting rods 24 should be made of high-temperature and corrosion-resistant materials to prevent contamination from corrosion or wear. Preferably, the lifting rods 24 are made of pure graphite, with a diameter (excluding the end surface) preferably between 2 mm and 15 mm.

A thickness of a sidewall of the crucible 22 are preferably between 5 mm and 25 mm, while a thickness of a sidewall of each of the storage compartments 231 is preferably between 0.5 mm and 3 mm.

Each lifting rod 24 can be adjusted either manually or mechanically, with a preference for mechanical control. In one embodiment, the bottom of the crucible 22 is provided with threaded holes, allowing the bottom of each storage compartment 231 to be sealed with the bottom of the crucible 22, and the bottom of each storage compartment 231 has a through hole. Each of the lifting rods 24 is first arranged in one of the threaded holes to threadedly engage with the threaded hole, and then extends into the through hole of the storage compartment 231, forming a piston-like structure. Each lifting rod 24 is configured to move upward and downward by adjusting a thread engagement length of the lifting rod 24 within the threaded hole 22, that is, each lifting rod 24 can be moved up or down by mechanically rotating the threads. In some other embodiments, an elastic structure such as a bellows can be installed inside the crucible 22 and connected to the bottom of the crucible 22. The lifting rod 24 extends upward from the bottom of the crucible 22, passes through the bellows, and extends into the corresponding storage compartment 231, keeping the storage compartment 231 sealed. A lifting device (such as a piston rod of a cylinder) can be used to raise the lifting rod 24, allowing for the movement of the lifting rod 24.

The device of the present disclosure may further comprise structures such as heaters and insulation devices.

The device of the present disclosure effectively prevents uneven distribution of raw materials caused by radial temperature gradient that results from increasing the crucible size. It also facilitates both axially symmetric and non-axially symmetric transport of raw materials, which is particularly beneficial for trying to obtain crystals with a diameter exceeding 8 inches and a thickness exceeding 15 mm, providing stable process conditions and significantly improving raw material utilization.

The present disclosure also provides a method for growing a silicon carbide single crystal based on a PVT method, which is especially suitable for growing larger silicon carbide single crystals, such as those with a diameter of 8 inches or more and a thickness of 15 mm or more. The method comprises following steps S1 to S4.

Step S1 includes providing a device as provided in the above embodiments, and further configuring the device such that a holder 25 where a silicon carbide seed crystal 26 is fixed is located in the growth chamber 21 and above the stock bin 23, the raw materials are stored in the storage compartments 231, and each of the one or more lifting rods 24 extends from the bottom of the crucible 22, passes through one of the storage compartments 231, and extends to the top of the storage compartment 231, keeping the storage compartment 231 sealed. In step S1, the holder 25 is first fixed into the growth chamber 21, then the lifting rods 24 passes through the storage compartments 231, and then a total of 3.5 kg to 12 kg of raw materials (depending on the specifications of the silicon carbide single crystal to be grown) are added into the stock bin 23; the stock bin 23 is then placed into the crucible 22, and the storage compartments 231 are sealed through threads at the bottom of the crucible 22; and finally, the crucible 22 is fixed to the growth chamber 21 and the crucible 22 is placed into the thermal field.

Step S2 includes placing the crucible 22 in the thermal field, and when the thermal field reaches a preset temperature and pressure, moving some of the lifting rods 24 near an edge of the stock bin to release gas-phase raw materials through exhaust holes of a first subset of the storage compartments 231, causing a surface of the silicon carbide seed crystal 26 to begin nucleating stably for a first period.

Step S3 includes moving other ones of the lifting rods 24 near a center of the stock bin to release gas-phase raw materials through exhaust holes of a second subset of the storage compartments 231, causing the surface of the silicon carbide seed crystal to continue nucleating stably for a second period.

Preferably, in steps S2 and S3, after the crucible 22 is placed in the thermal field, an initial atmosphere in the thermal field is at a pressure of 500 mbar to 800 mbar, then the crucible is heated and stays at 2200° C.-2450° C. for 30 min to 5 h, and the pressure is reduced to 0.5 mbar to 50 mbar over a period of 1 h to 15 h. A height of the lifting rods 24 is adjusted to release the gas-phase raw materials from the tops of the storage compartments 231 near the edge of the crucible 22. After the surface of the silicon carbide seed crystal 26 begins to nucleate and grow stably for 5 to 50 hours, the temperature within the crucible 22 is increased by 0 to 50° C. If the external temperature is sufficiently high, the raw materials within the crucible 22 will start to evaporate without further heating. However, if the raw materials cannot be released from the sealed crucible 22, and the external temperature is not high enough, gradual heating is required to achieve stepwise evaporation from the outside to the inside. This heating step is optional based on process needs. The gas-phase raw materials are then released from the tops of the storage compartments 231 near the center of the crucible 22, allowing the silicon carbide seed crystal 26 to stably grow for another 5 to 50 hours. Preferably, when using a silicon carbide seed crystal 26 with an offset angle greater than 2° between its C-plane [0001] and its A-plane [$11\bar{2}0$], the gas-phase raw materials released from those of the storage compartments below the C-plane can be selectively reduced. For example, under the C-plane [0001], several storage compartments 231 can be left empty, or the amount of raw materials in the storage compartments 231 directly below can be reduced. Alternatively, only some of the storage compartments 231 directly below can be partially filled or left empty. That is, by adjusting the amounts of the raw materials in different storage compartments, the release of the gas-phase raw materials from the storage compartments 231 below the C-plane [0001] can be selectively reduced, enabling the silicon carbide seed crystal to grow with a non-axisymmetric concentration under an axisymmetric temperature distribution.

Step S4 includes: repeating steps S2 and S3 until the gas-phase raw materials in the storage compartments are completely released, completing growth of the silicon carbide single crystal.

Preferably, after the growth of the silicon carbide single crystal is completed, an inert gas such as argon is introduced into the thermal field to adjust the pressure inside the crucible 22 to between 100 mbar and 600 mbar; a heating power is reduced to zero over 5 h to 10 h, and the crucible is naturally cooled to room temperature before removing the silicon carbide single crystal.

In order to make the technical solutions and beneficial technical effects of the present disclosure more clearer, the present disclosure is described in further detail below through the following embodiments in conjunction with the accompanying drawings.

Comparative Embodiment

Figure 2:
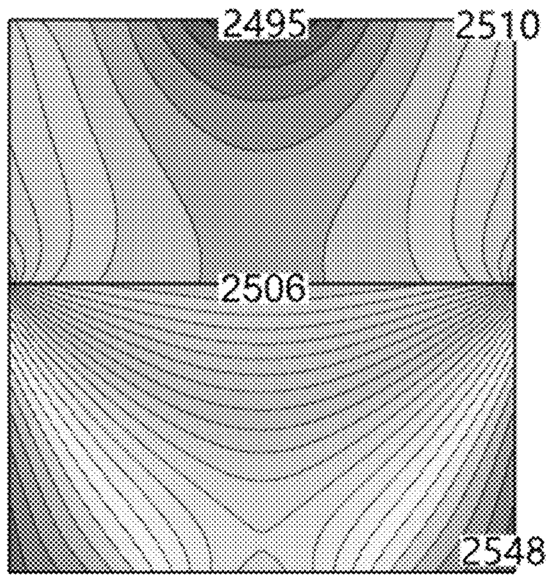
FIG. 2 shows an isothermal contour map of the temperature distribution inside the crucible in FIG. 1.
Figure 3:
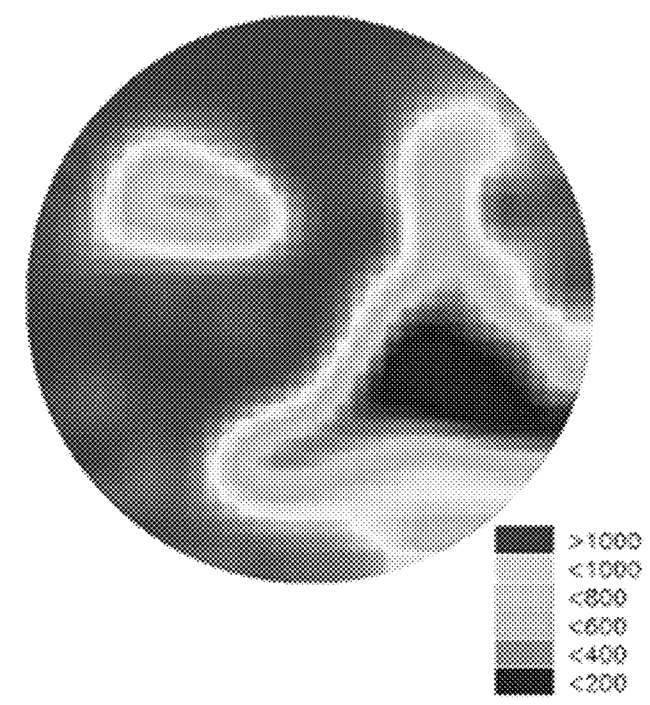
FIG. 3 shows a defect distribution diagram of a crystal under a non-axisymmetric temperature distribution within the crucible in FIG. 1.

As shown in FIG. 1, a crucible 11 containing raw materials is placed in a thermal field and heated to 2550° C., and an isothermal contour map of the temperature distribution inside the crucible at this temperature is shown in FIG. 2. The numbers in FIG. 2 represent different temperatures in Kelvin. From FIG. 2, it can be seen that the isothermal lines are parabolic, indicating that the evaporation of the raw materials is sequential. The center is a low-temperature area, so if the gas-phase raw materials from the center and the edges are released together, the corresponding central area will form clumps due to the low temperature. In FIG. 1, the gas-phase raw materials in a high-temperature zone 12 of the crucible gradually diffuses to a seed crystal 13 and also continuously solidifies in a low-temperature zone 14. As the crystal 15 continues to grow, the high-temperature zone 12 becomes more hollow, and the solidified raw materials in the low-temperature zone will suddenly fall into the high-temperature zone 12, causing a sudden change in the crystal growth conditions. Additionally, due to the changes in the raw materials, the silicon carbide composition in the crystal growth zone 16 also continuously changes. During the initial decomposition of the raw materials, silicon-rich gas-phase raw materials are released to nucleate, but as growth continues, the silicon in the high-temperature zone 12 gradually decreases, and the crystallized raw materials in the low-temperature zone 14 becomes difficult to decompose, further exacerbating the changes in growth conditions, leading to a decline in crystal quality. Referring to the defect distribution diagram of the crystal 15 under the non-axisymmetric temperature distribution shown in FIG. 3, the numbers in FIG. 3 represent the number of defects, and the color at the same depth represents the same stress defect distribution. If the color difference between two areas is significant, it indicates a significant difference in stress defect distribution between these two areas. Because the seed crystal has a 4-degree offset angle, the crystal is not axisymmetric. Therefore, some solutions use an asymmetric thermal field to adapt to the asymmetric crystal, resulting in fewer defects on one end and more on the other, leading to a higher likelihood of the crystal cracking.

Embodiment 1

Based on the typical isothermal line distribution in the thermal field inside the crucible, the present disclosure improves the existing device structure. For example, as shown in FIG. 4, the stock bin 23 with multiple independent storage compartments 231 (including a first storage compartment 231*a*, a second storage compartment 231*b*, a third storage compartment 231*c*, a fourth storage compartment 231*d*, and a fifth storage compartment 231*e*, each arranged concentrically within the crucible 22 based on their inner diameters) is utilized. A top surface of the stock bin 23 is parabolic, being lower in the middle and higher at the edges. The method for growing the silicon carbide single crystal based on the PVT method in Embodiment 1 comprises following steps S1 to S6.

In step S1, as shown in FIG. 4, the silicon carbide seed crystal 26 with a diameter of 8 inches is first pre-attached to the holder 25 and fixed to the growth chamber 21.

In step S2, as shown in FIG. 5, the lifting rod 24 passes through the storage compartment 231, and the exhaust hole 235 having a diameter of 2 mm is located at the top 234 of the storage compartment 231 and serves as the channel for gas-phase raw materials transmission. The lower portion of the exhaust hole 235 has a conical surface with a conical angle of 15°. A total of 5 kg of raw materials is added to the stock bin 23, and then the stock bin 23 is placed into the crucible 22. The lifting rod 24 rotates and moves upward through the threads at the bottom of the crucible 22, sealing the storage compartment 231 by abutting the exhaust hole 235 at the top 234 of the storage compartment 231. The crucible 22 is fixed to the growth chamber 21 and then placed into the thermal field.

In step S3, when the pressure of the thermal field is adjusted to 600 mbar, the crucible 22 is first heated and stays at 2350° C. for 2 h, and then the pressure is reduced to 20 mbar over a period of 5 h.

In step S4, as shown in FIG. 4, the lifting rod 24 in the first storage compartment 231*a* is lowered by 3 mm, releasing the gas-phase raw materials from the top of the first storage compartment 231*a*. The surface of the silicon carbide seed crystal 26 begins to nucleate and grow stably for 10 hours, and the temperature within the crucible 22 is increased to 2360° C. After obtaining the silicon carbide single crystal, the lifting rod 24 in the second storage compartment 231*b* is lowered by 3 mm, and the silicon carbide single crystal grows stably for another 10 hours while increasing the temperature within the crucible 22 to 2370° C.

In step S5, step S4 is repeated until the gas-phase raw materials in the first storage compartment 231*a* to the fifth storage compartment 231*e* in the crucible 22 are completely released.

In step S6, after the growth of the silicon carbide single crystal is completed, the pressure of the thermal field is adjusted to 100 mbar, the heating power is reduced to zero over 10 h, and the crucible is naturally cooled to room temperature before taking out the silicon carbide single crystal.

Upon inspection, the obtained 8-inch silicon carbide single crystal has a thickness of 24 mm, a mass of 3.2 kg, and a raw material conversion efficiency of 64%.

Embodiment 2

$$SiC \Leftrightarrow C_{(s)} + Si_{(l,g)} \quad \text{Equation 1}$$

$$F_{\tau} = 6\pi^2 R C_s \nabla T / [\rho T(1 + 3C_m \mu / R)] \quad \text{Equation 2}$$

Equation 1 describes the decomposition and formation of silicon carbide, while Equation 2 is a thermophoretic force formula for graphite particles, where $F_{\tau}$ is the thermophoretic force, R is the radius of the graphite powder, $C_s$ is the thermal slip coefficient, $\nabla T$ is the temperature gradient, ρ is the density of graphite, T is the temperature, $C_m$ is the momentum exchange coefficient, and μ is the mean free path of gas molecules.

Based on the above formulas, to achieve a faster growth rate of the silicon carbide single crystal, when the process temperature approaches 2500° C., the pressure of Si near the surface of the raw materials will be around 2 mbar (1 mbar=100 Pa). At this point, the lifting rod moves downward, causing intense decomposition and formation of silicon carbide at the top of the stock bin, resulting in graphite powder. Since the thermophoretic force is proportional to the radius of the graphite powder R and the temperature gradient $\nabla T$, and due to the pressure difference between the stock bin and the growth chamber, the graphite particles are further pushed by the pressure. When the gravity of the graphite particles is insufficient to overcome the two thrusts, the graphite particles rise to the seed crystal, causing crystal quality defects. To address this, a thin plate with a thickness of 0.5 mm can be used to seal the top of the stock bin. Due to the sealing effect, when the temperature with the crucible 22 reaches 2500° C., the slight decomposition of the raw materials causes the pressure in the stock bin to increase, preventing continuous decomposition of the raw materials. The crystal growth in Embodiment 2 comprises following steps S1 to S6.

In step S1, the holder 25 where the silicon carbide seed crystal 26, with a diameter of 200 mm and a growth surface with a 4-degree offset from the C-plane [0001] to the A-plane [11$\bar{2}$0] is fixed in the growth chamber 21 (see FIG. 4 for details).

In step S2, as shown in FIG. 7, the lifting rod 24 passes through the storage compartment 231, the top of the storage compartment 231 is sealed with a graphite flake 233 (also defined as graphite thin cover), and 5 kg of raw materials is added into the stock bin. The end surface of the lifting rod 24 is arc-shaped. Referring to FIG. 6, the storage compartments 231 marked with "f" are located directly below the C-plane [0001] of the silicon carbide seed crystal 26 and are not loaded with raw materials. The stock bin 23 is placed into the crucible, and the top of each storage compartment 231 is abutted by a corresponding lifting rod 2. The crucible 22 is fixed to the growth chamber 21, and is then placed into the thermal field.

In step S3, when the pressure of the thermal field is adjusted to 600 mbar, the crucible is first heated and stays at 2450° C. for 2 h, and then the pressure is reduced to 5 mbar over a period of 5 h.

In step S4, the lifting rods 24 in the storage compartments 231 near the edges of the crucible are raised by 5 mm, breaking the graphite flakes 233 at the tops of the storage compartments 231, and allowing the gas-phase raw materials to volatilize to the surface of the silicon carbide seed crystal 26. The surface of the silicon carbide seed crystal 26 begins to nucleate and grow stably for 10 hours, and the temperature within the crucible 22 is increased to 2460° C. After obtaining the silicon carbide single crystal, the lifting rods 24 in the storage compartments 231 are raised by another 5 mm, and the silicon carbide single crystal grows stably for another 10 hours while increasing the temperature within the crucible 22 to 2470° C.

In step S5, step S4 is repeated until the gas-phase raw materials in the storage compartments 231 in the crucible 22 are completely released.

In step S6, after the growth of the silicon carbide single crystal is completed, the pressure of the thermal field is adjusted to 100 mbar, the heating power is reduced to zero over 10 h, and the crucible is naturally cooled to room temperature before removing the silicon carbide single crystal.

Upon inspection, the obtained silicon carbide single crystal has a diameter of 200 mm, a thickness of 22 mm, and a mass of 2.9 kg. Due to the increased diffusion area of the raw materials, the inclusions in the crystal are reduced. At the same time, referring to FIG. 8, it can be seen that the method in Embodiment 2 uses axisymmetric temperature distribution to achieve asymmetric growth, effectively reducing micro-defects in the crystal.

Embodiment 3

During the process of opening the stock bin, the lifting rods may be corroded by the silicon in the raw materials, potentially causing the stock bin to open abnormally. To address this, in Embodiment 3, each storage compartment 231 can adopt a design as shown in FIG. 9, that is, the top of each storage compartment 231 can be sealed with a graphite paper 232 with a thickness of 1 mm and a graphite flake 233 with a diameter of 5 mm and a thickness of 2 mm. The graphite flake 233 is positioned below the graphite paper 232 and will first come into contact with the corresponding lifting rod 24. The end surface of each lifting rod 24 is arc-shaped, with a roughness of 1.6 μm. During the growth process, the lifting rod 24 applies pressure to the graphite flake 233, ensuring that the graphite paper 232 had an opening of at least 5 mm in diameter, which guarantees a relatively consistent raw material evaporation area for each storage compartment, thereby further stabilizing the process.

In summary, by dividing the stock bin into independent storage compartments and using the lifting rods to release the gas-phase raw materials in the storage compartments based on the needs of various stages of the growth of the silicon carbide single crystal, the device of the present disclosure enables the gradual evaporation of the raw materials across different temperature zones, keeping the concentration of each component consistent throughout the entire growth of the silicon carbide single crystal. Additionally, since the raw materials in the central low-temperature area can be fully utilized in the later stages of crystal growth, the utilization rate of raw materials with this device can be increased by more than 10% compared to traditional devices. Furthermore, while maintaining the axial symmetry of the thermal field, the device of the present disclosure can more effectively achieve asymmetric growth to suppress defects and prevent crystal cracking caused by asymmetric stress, significantly improving the quality of crystal growth. Therefore, the present disclosure effectively overcomes various shortcomings in the existing technology and has high industrial utilization value.

The above-mentioned embodiments are for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the scope of the present disclosure.

The invention claimed is:

1. A device for growing a silicon carbide single crystal based on a PVT method, comprising a growth chamber, a crucible, and a stock bin for holding raw materials, wherein the crucible and the stock bin are located in the growth chamber, and the stock bin is located in the crucible, wherein the stock bin comprises independent storage compartments, and the device further comprises one or more lifting rods, wherein each of the lifting rods is located in the growth chamber, extends from a bottom of the crucible, passes through a bottom of one of the storage compartments, and extends to a top of the storage compartment, wherein the lifting rod moves upward and downward to seal the storage compartment, or creating a channel for gas-phase raw materials transmission at the top of the storage compartment.

2. The device according to claim 1, wherein an exhaust hole is located at the top of each storage compartment and serves as the channel for gas-phase raw materials transmission, wherein a top of each lifting rod is provided with an end surface matching the corresponding exhaust hole, wherein when the lifting rod moves upward and the end surface of the lifting rod abuts the exhaust hole, the storage compartment is sealed, and wherein when the lifting rod moves downward and the end surface of the lifting rod is away from the exhaust hole, gas-phase raw materials are discharged from the storage compartment through the exhaust hole.

3. The device according to claim 2, wherein a diameter of each exhaust hole ranges from 0.1 mm to 5 mm, and a lower portion of each exhaust hole is provided with a conical surface that matches the end surface of the corresponding lifting rod, with a conical angle of the conical surface ranging from 5° to 85°.

4. The device according to claim 3, wherein a frustum with a height of 1 mm to 5 mm and a diameter of 1 mm to 10 mm is located at the top of each lifting rod, and the frustum is connected with the end surface of the lifting rod.

5. The device according to claim 1, wherein each storage compartment is sealed by a graphite thin cover and/or several layers of graphite paper, with a thickness of the graphite thin cover ranging from 0.1 mm to 2 mm, and the lifting rod moves upward to form a hole in the graphite thin cover and/or the several layers of graphite paper, creating the channel for gas-phase raw materials transmission.

6. The device according to claim 5, wherein an end surface of each lifting rod is arc-shaped, and a roughness of the end surface is not greater than 1.6 μm.

7. The device according to claim 1, wherein the storage compartments of the stock bin are concentric circular structures or concentric polygonal structures arranged inside the crucible based on their inner diameters;

or, planar shapes of the storage compartments comprise one or more of triangles, quadrilaterals, hexagons, and circles, and the storage compartments are arranged in a honeycomb pattern.

8. The device according to claim 1, wherein a top of the stock bin has a parabolic structure with a lower middle and higher edges.

9. The device according to claim 1, wherein a thickness of a sidewall of the crucible ranges from 5 mm to 25 mm, and a thickness of a sidewall of each of the storage compartments ranges from 0.5 mm to 3 mm; wherein each lifting rod is a graphite rod with a diameter of 2 mm to 15 mm.

10. The device according to claim 1, wherein the bottom of the crucible is provided with threaded holes, and each of the lifting rods is arranged in one of the threaded holes and is threadedly engaged with the threaded hole; wherein each lifting rod is configured to move upward and downward by adjusting a thread engagement length of the lifting rod within the threaded hole.

11. A method for growing a silicon carbide single crystal based on a PVT method, comprising:

S1: providing a device according to claim 1, and further configuring the device such that a holder where a silicon carbide seed crystal is fixed is located in the growth chamber and above the stock bin, the raw materials are stored in the storage compartments, and each of the one or more lifting rods extends from the bottom of the crucible, passes through one of the storage compartments, and extends to the top of the storage compartment, keeping the storage compartment sealed;

S2: placing the crucible in a thermal field, and when the thermal field reaches a preset temperature and pressure, moving some of the lifting rods near an edge of the stock bin to release gas-phase raw materials through exhaust holes of a first subset of the storage compartments, causing a surface of the silicon carbide seed crystal to begin nucleating stably for a first period;

S3: moving other ones of the lifting rods near a center of the stock bin to release gas-phase raw materials through exhaust holes of a second subset of the storage compartments, causing the surface of the silicon carbide seed crystal to continue nucleating stably for a second period; and S4: repeating steps S2 and S3 until the gas-phase raw materials in the storage compartments are completely released, completing growth of the silicon carbide single crystal.

12. The method according to claim 11, wherein when using a silicon carbide seed crystal with an offset angle greater than 2° between a C-plane [0001] and an A-plane $[11\bar{2}0]$, amounts of the raw materials in different storage compartments are adjusted to selectively reduce gas-phase raw materials released from those of the storage compartments below the C-plane, enabling the silicon carbide seed crystal to grow with a non-axisymmetric concentration under an axisymmetric temperature distribution.

13. The method according to claim 11, wherein after the crucible is placed in the thermal field, an initial atmosphere in the thermal field is at a pressure of 500 mbar to 800 mbar, then the crucible is heated and stays at 2200° C.-2450° C. for 30 min to 5 h, and the pressure is reduced to 0.5 mbar to 50 mbar over a period of 1 h to 15 h; wherein the first period and the second period are both 5 h to 50 h; wherein after the growth of the silicon carbide single crystal is completed, the pressure of the thermal field is adjusted to 100 mbar to 600 mbar, a heating power is reduced to zero over 5 h to 10 h, and the crucible is naturally cooled to room temperature before removing the silicon carbide single crystal.

14. The method according to claim 11, wherein the silicon carbide single crystal is greater than or equal to 8 inches, and a thickness of the silicon carbide single crystal is greater than or equal to 15 mm.

* * * * *